United States Patent
Liu et al.

(10) Patent No.: US 6,492,245 B1
(45) Date of Patent: Dec. 10, 2002

(54) METHOD OF FORMING AIR GAP ISOLATION BETWEEN A BIT LINE CONTACT STRUCTURE AND A CAPACITOR UNDER BIT LINE STRUCTURE

(75) Inventors: Yuan-Hung Liu, Hsinchu; Yeur-Luen Tu, Taichung, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/978,228

(22) Filed: Oct. 16, 2001

(51) Int. Cl.[7] ............... H01L 21/76; H01L 21/8242; H01L 21/20
(52) U.S. Cl. ............... 438/422; 438/248; 438/255; 438/391; 438/421; 438/411
(58) Field of Search ................ 438/258, 421, 438/422, 411, 171, 239, 238, 243, 248, 255, 386, 391, 597, 672, 675

(56) References Cited

U.S. PATENT DOCUMENTS

| | | | |
|---|---|---|---|
| 5,914,519 A | 6/1999 | Chou et al. | 257/410 |
| 5,953,625 A | 9/1999 | Bang | 438/619 |
| 6,090,698 A | 7/2000 | Lee | 438/619 |
| 6,146,961 A | 11/2000 | Graettinger et al. | 438/396 |
| 6,165,839 A * | 12/2000 | Lee et al. | 438/253 |
| 6,190,996 B1 * | 2/2001 | Mouli et al. | 257/522 |
| 6,214,719 B1 * | 4/2001 | Nag | 438/421 |
| 6,306,721 B1 * | 10/2001 | Teo et al. | 438/254 |

FOREIGN PATENT DOCUMENTS

KR    1020010045911    *    6/2001    ......... H01L/27/108

* cited by examiner

Primary Examiner—Richard Elms
Assistant Examiner—Adam Pyonin
(74) Attorney, Agent, or Firm—George O. Saile; Stephen B. Ackerman (57) ABSTRACT

A process for forming air gap isolation regions between a bit line contact structure and adjacent capacitor structures, to reduce the capacitance of the space between these structures, has been developed. The process features the formation of insulator spacers on the sides of capacitor openings. After formation of capacitor structures, in the capacitor openings, top portions of the insulator spacers are exposed via a first selective etch procedure, allowing a second, selective, isotropic etch procedure to completely remove the insulator spacers creating the air gap isolation regions now located between the capacitor structure and an adjacent insulator layer. Subsequent deposition of an overlying insulator layer, comprised with poor conformality properties, allows coverage of the capacitor structures, however without filling the air gap isolation regions.

19 Claims, 6 Drawing Sheets

METHOD OF FORMING AIR GAP ISOLATION BETWEEN A BIT LINE CONTACT STRUCTURE AND A CAPACITOR UNDER BIT LINE STRUCTURE

BACKGROUND OF THE INVENTION (1) Field of the Invention

The present invention relates to methods used to fabricate semiconductor devices and more specifically to a method used to decrease the capacitance between a bit line structure and a capacitor structure, used as elements in a dynamic random access memory (DRAM), cell.

(2) Description of Prior Art

The advent of micro-miniaturization, or the ability to fabricate semiconductor devices with sub-micron features, has allowed the semiconductor industry to increase device performance while still reducing processing costs. The use of smaller device features allow reductions in performance degrading parasitic junction capacitances to be realized, resulting in the desired, improved performance objective to be realized. In addition the use of sub-micron features allow an increased number of smaller semiconductor chips to be obtained from a specific size starting substrate, thus reducing the processing cost of a specific semiconductor chip. However in contrast to the reduction in parasitic junction capacitance for a device formed with sub-micron features, a reduction in the space between a bit line structure and a capacitor structure, for a capacitor under bit line (CUB), DRAM device, is also encountered, thus resulting in unwanted capacitance increases, and in turn deleteriously influencing device performance.

This invention will describe a novel process sequence used to reduce the capacitance between the bit line and capacitor structures of CUB DRAM devices, via use of air gaps created in portions of the spaces between these DRAM elements. The air gaps are created as pseudo spacers, formed on the sides of the openings used to accommodate subsequent capacitor structures. The use of air gap isolation between the bit line and capacitor structures allows the capacitance of these closely placed elements, introduced via the use of sub-micron features, to be minimized. Prior art, such as Lee, in U.S. Pat. No. 6,090,698, describes the use of horizonal air gaps located between dielectric layers, to reduce the capacitance of a composite dielectric layer, however that prior art does not offer the novel process sequence described in the present invention in which air gap regions are formed along the vertical sides of a DRAM a capacitor opening, via formation of, and removal of, sidewall spacers.

SUMMARY OF THE INVENTION

It is an object of this invention to fabricate a capacitor under bit line (CUB), DRAM device, using sub- micron features.

It is another object of this invention to reduce the capacitance between a bit line contact structure and capacitor structures via formation of air gap isolation regions in portions of the space located between these structures.

It is still another object of this invention to form the air gap isolation regions via formation of a spacer shape on the sides of a capacitor opening, followed by selective removal of the spacer shape, performed after formation of the capacitor structure, creating the desired air gap regions.

In accordance with the present invention a method of forming air gap isolation regions in portions of the spaces located between a bit line contact structure and DRAM capacitor structures, is described. After formation of transfer gate transistor structures, on a semiconductor substrate, conductive plug structures are formed overlying source/drain regions located in portions of the semiconductor substrate not covered by the transfer gate transistors. After deposition of a first insulator, capacitor openings are formed in the first insulator layer, exposing portions of the top surface of a group of conductive plug structures, which will subsequently be used to underlay capacitor structures. Insulator spacers are next formed on the vertical sides of the capacitor openings, followed by the formation of capacitor structures located in the capacitor openings, with a top portion of the capacitor structure partially overlying the top surface of the first insulator layer. The first insulator layer is next selectively etched backed, exposing a top portion of the insulator spacers, followed by selective removal of the entire insulator spacers, resulting in air gaps located between the capacitor structures, in the capacitor openings, and the thinned first insulator layer. A second insulator layer, exhibiting poor coverage characteristics, is then deposited on the thinned first insulator layer and on the capacitor structures, however not filling the air gaps, thus providing a seal for air gap regions. A bit line contact opening is then formed in the second insulator layer, and in the thinned first insulator layer, between the capacitor structures, exposing the top surface of a bit line conductive plug structure. Formation of a bit line contact structure is then accomplished in the bit line contact hole opening, with the capacitance between the bit line contact structure and the capacitor structures reduced via use of the air gap isolation regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
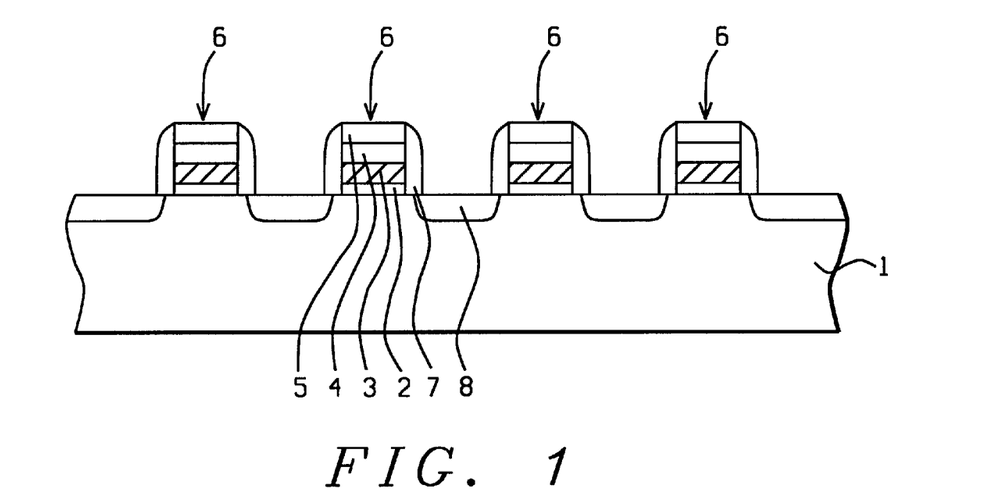
FIGS. 1–11, which schematically, in cross-sectional style, describe key stages of fabrication of a CUB DRAM device featuring the formation of air gap isolation regions, located between a bit line contact structure and capacitor structures, used to reduce the capacitance between these DRAM elements.

The method of forming a capacitor under bit line (CUB), DRAM device, featuring air gap isolation regions formed between the DRAM bit line contact structure, and capacitor structures, to reduce capacitance between these structures, will now be described in detail. A P type semiconductor substrate 1, comprised of single crystalline silicon with a <100> crystallographic orientation, is used and schematically shown in FIG. 1. Silicon nitride capped gate structures 6, are formed on gate insulator layer 2. Gate insulator layer 2, is a silicon dioxide layer thermally grown to a thickness between about 60 to 80 Angstroms. Silicon nitride capped gate structures 6, are formed via photolithographic and dry etching procedures performed to an overlying silicon nitride layer 5, a silicon oxide layer 4, and a polysilicon layer 3. Polysilicon layer 3, at a thickness between about 1000 to 2000 Angstroms, was obtained via low pressure chemical vapor deposition (LPCVD), procedures, with polysilicon layer 3, either doped in situ during deposition via the addition of arsine or phosphine to a silane ambient, or deposited intrinsically then doped via implantation of arsenic of phosphorous ions. Silicon oxide layer 4, was next deposited via LPCVD or plasma enhanced chemical vapor deposition (PECVD), procedures, at a thickness between about 600 to 1200 Angstroms, followed by the deposition of silicon nitride layer 5, at a thickness between about 500 to 1000 Angstroms, via LPCVD or PECVD procedures. After formation of the gate structure, defining photoresist shape, (not shown in the drawings), an anisotropic, reactive ion etching (RIE), procedure, using $CF_4$ and $CHF_3$ as etchants for silicon nitride layer 5, using $CF_4$ and $CHF_3$ as etchants for silicon oxide layer 4, and using $Cl_2$ or $SF_6$ as an etchant for polysilicon layer 3, was employed to define silicon nitride capped gate structures 6, schematically shown in FIG. 1.

After removal of the photoresist shape used to define silicon nitride capped gate structures 6, via plasma oxygen ashing procedures, insulator spacers 7, are formed on the sides of silicon nitride capped gate structures 6. This is accomplished via deposition of a silicon nitride layer, or a silicon oxide layer, to a thickness between about 300 to 700 Angstroms, via LPCVD or PECVD procedures, followed by an anisotropic RIE procedure, using $CF_4$ or $CHF_3$ as an etchant, resulting in the formation of insulator spacers 7. Heavily doped N type source/drain regions 8, are next formed in regions of semiconductor substrate 1, not covered by silicon nitride capped gate structures 6, via implantation of arsenic or phosphorous ions, at an energy between about 15 to 25 KeV, at a dose between about 1E13 to 1E14 atoms/$cm^2$. The result of these procedures are shown schematically in FIG. 1.

Figure 2:
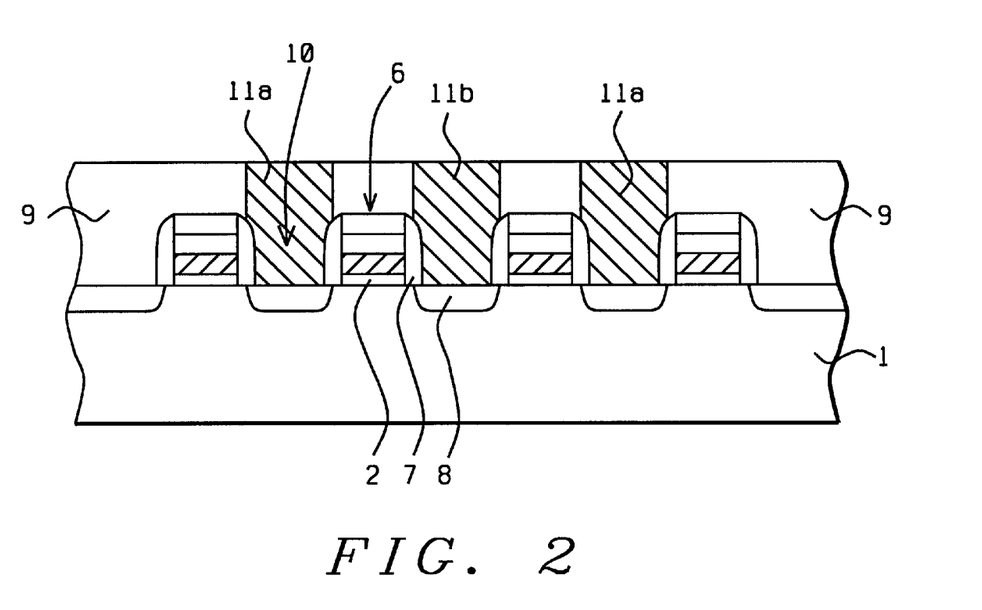

Inter-polysilicon dielectric (IPD), layer 9, shown schematically in FIG. 2, is deposited via LPCVD or PECVD procedures, to a thickness between about 8000 to 9000 Angstroms, followed by a chemical mechanical polishing (CMP), used to planarize IPD layer 9. IPD layer 9, is a silicon oxide layer obtained via LPCVD or PECVD procedures at a thickness between about 6000 to 9000 Angstroms. Conventional photolithographic and RIE procedures, using $CH_2F_2$ and $C_4F_8$ as etchants for IPD layer 9, are used to define plug openings 10, in IPD layer 9, exposing portions of the top surface of heavily doped N type source drain regions 8. After removal of the photoresist shape, (not shown in the drawings), used to define plug openings 10, a conductive layer, such as in situ doped polysilicon, is deposited via LPCVD procedures to a thickness between about 3000 to 4000 Angstroms, completely filling plug openings 10. Another CMP procedure is then employed to remove regions of the in situ doped polysilicon layer from the top surface of IPD layer 9, resulting in the formation of plug structures 11a, to be used for contact to subsequently formed capacitor structures, and the formation of plug structure 11b, to be used for contact to a subsequently formed bit line contact structure. The result of these procedures is schematically shown in FIG. 2.

Figure 3:
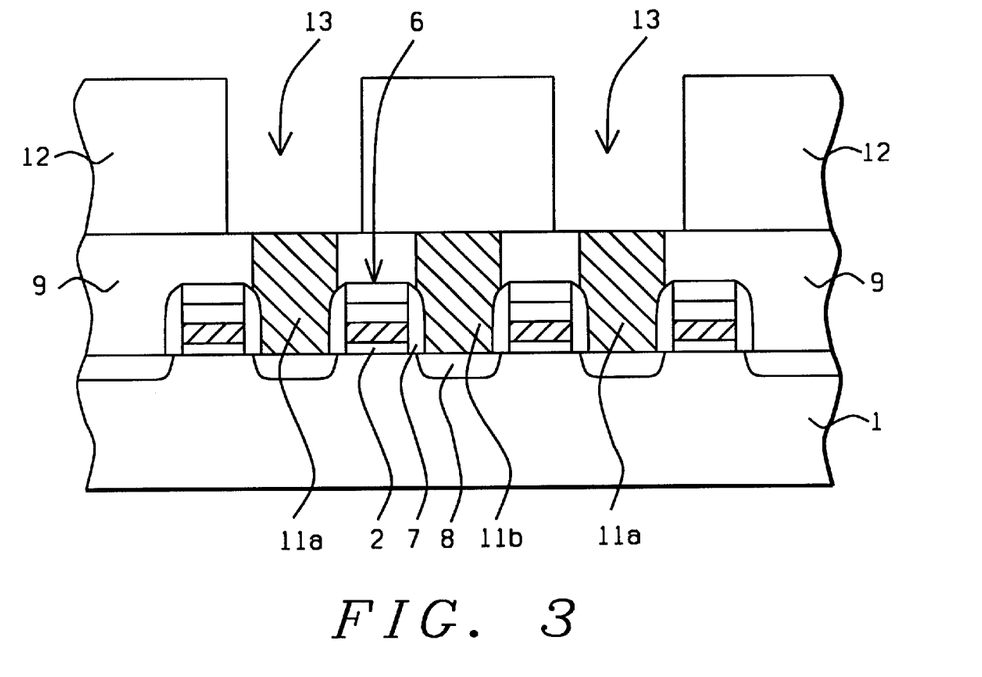
Figure 4:
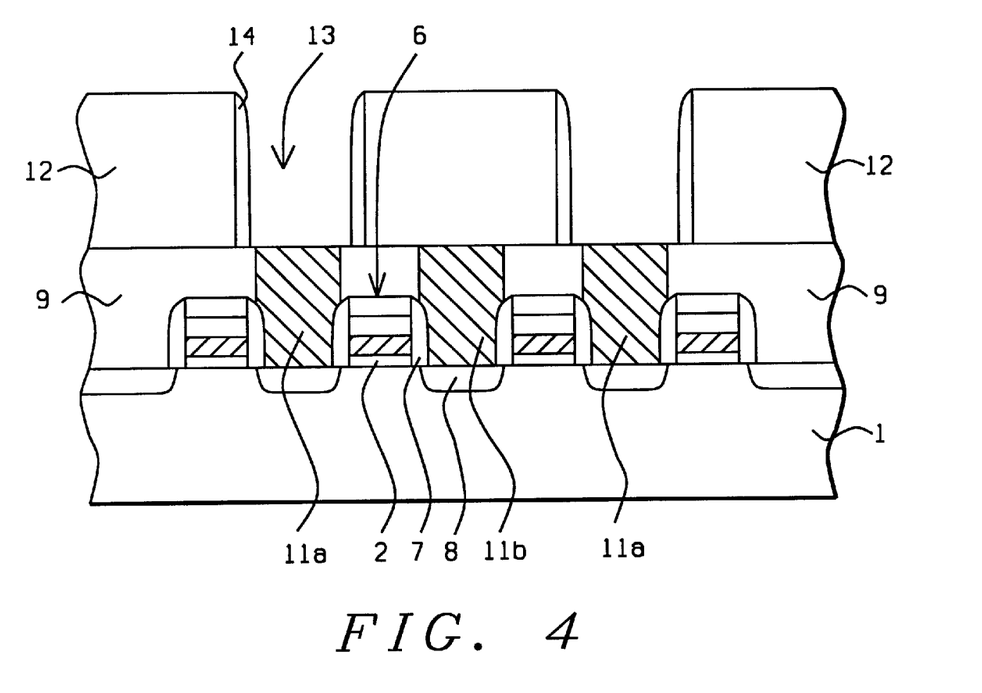

Inter-polysilicon layer 12, is next deposited to a thickness between about 21000 to 25000 Angstroms, via LPCVD or PECVD procedures. IPD layer 12, is again a silicon oxide layer. A photoresist shape, (not shown in the drawings), is used as a mask to allow an anisotropic RIE procedure, using $C_4F_8$ as an etchant, to create capacitor openings 13, in IPD layer 12. The RIE procedure is terminated at the appearance of the top surface of plug structures 11a, and 11b. The photoresist used to define capacitor openings 13, shown schematically in FIG. 3, is then removed via plasma oxygen ashing procedures. Critical, insulator spacers 14, shown schematically in FIG. 4, are next formed on the sides of capacitor openings 13. Insulator spacers 14, are formed via deposition of a silicon nitride layer, via PECVD or LPCVD procedures, to a thickness between about 300 to 500 Angstroms. An anisotropic RIE procedure, using $CF_4$ and $CHF_3$ as etchants, is then used to define insulator spacers 14, on the sides of capacitor openings 13. If desired borophosphosilicate glass (BPSG), can be employed as insulator spacers 14. This is accomplished via deposition of a BPSG layer, via PECVD procedures, to a thickness between about 300 to 500 Angstroms, followed by an anisotropic RIE procedure, using $C_4F_8$ as an etchant.

Figure 5:
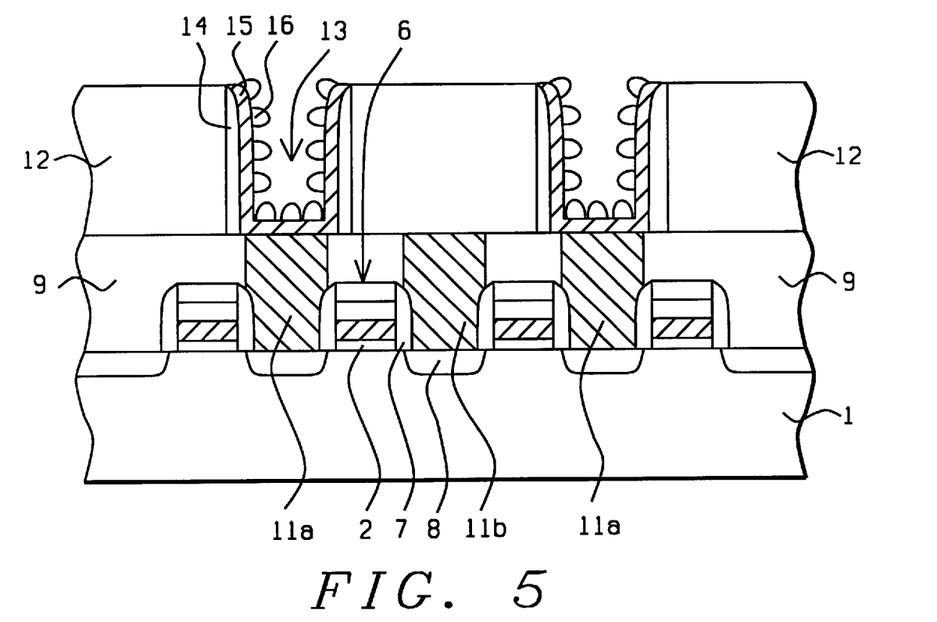

The formation of the capacitor storage node structure is next addressed and schematically shown in FIG. 5. An in situ doped, N type polysilicon layer 15, is first deposited via LPCVD procedures, to a thickness between about 700 to 1000 Angstroms. A layer of hemispherical grain (HSG), silicon 16, at a thickness between about 200 to 300 Angstroms, is next formed on the surface of polysilicon layer 15, via deposition of an amorphous silicon layer, via LPCVD procedures, at a temperature between about 500 to 540° C., followed by an anneal procedure performed at a temperature between about 550 to 600° C., at a pressure less than 1.0 torr, allowing transition from the amorphous silicon form to the desired HSG silicon layer 16, to occur. The roughness of HSG silicon layer 16, will provide additional surface area for the capacitor storage node structure, thus providing increased capacitor storage. A CMP procedure is next employed to remove regions of HSG silicon layer 16, as well as regions of polysilicon layer 15, from the top surface of IPD layer 12, resulting in storage node structures, comprised of HSG silicon—polysilicon, in capacitor openings 13, overlying and contacting the plug structure 11a, and plug structure 11b.

Figure 6:
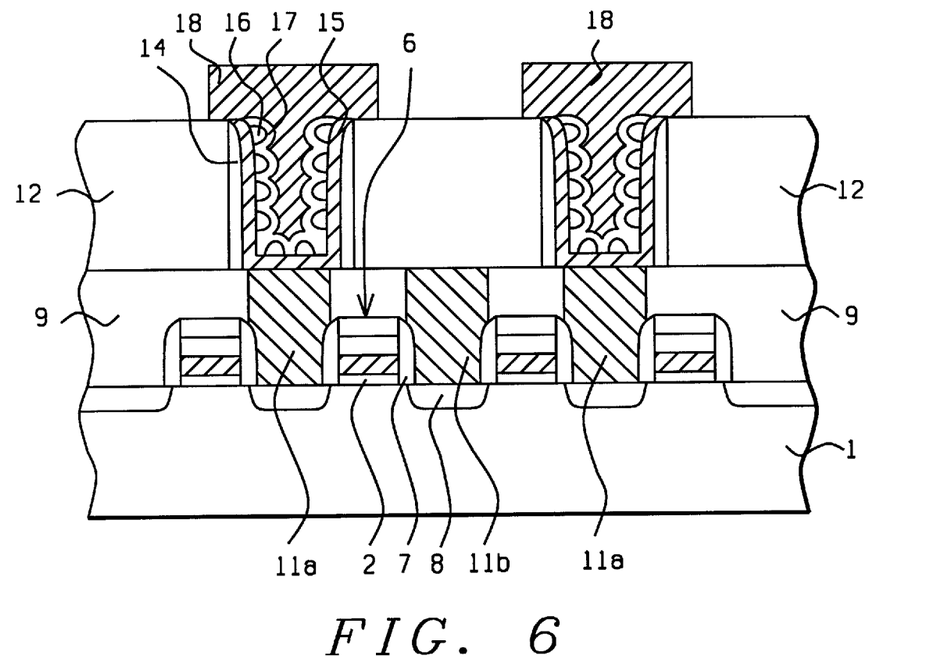

The completion of the capacitor structure, comprising the formation of the capacitor dielectric layer, and the formation of the capacitor top plate, is next addressed and schematically described in FIG. 6. A capacitor dielectric layer 17, such as oxidized silicon nitride on oxide (ONO), oxidized silicon nitride (NO), or tantalum oxide, is formed on the surface of HSG silicon layer 16, at an equivalent silicon oxide thickness (Teff) between about 30 to 50 Angstroms. The tantalum oxide option is achieved via plasma vapor deposition procedures, while the ONO and NO dielectric layers are obtained via deposition of a silicon nitride—silicon oxide layer, followed by oxidation of a top portion of the silicon nitride—silicon oxide layer. An in situ doped, polysilicon layer is next deposited via LPCVD procedures to a thickness between about 500 to 1000 Angstroms, completely filling capacitor openings 13. A photoresist shape, (not shown in the drawings), is next used as an etch mask to allow an anisotropic RIE procedure, using $Cl_2$ as an etchant for the polysilicon layer to define polysilicon top plate structure 18, schematically shown in FIG. 6. While the bottom portion of polysilicon top plate structure 18, resides in capacitor opening 13, a top portion of polysilicon top plate structure 18, overlays a portion of the top surface of IPD layer 12.

Figure 7:
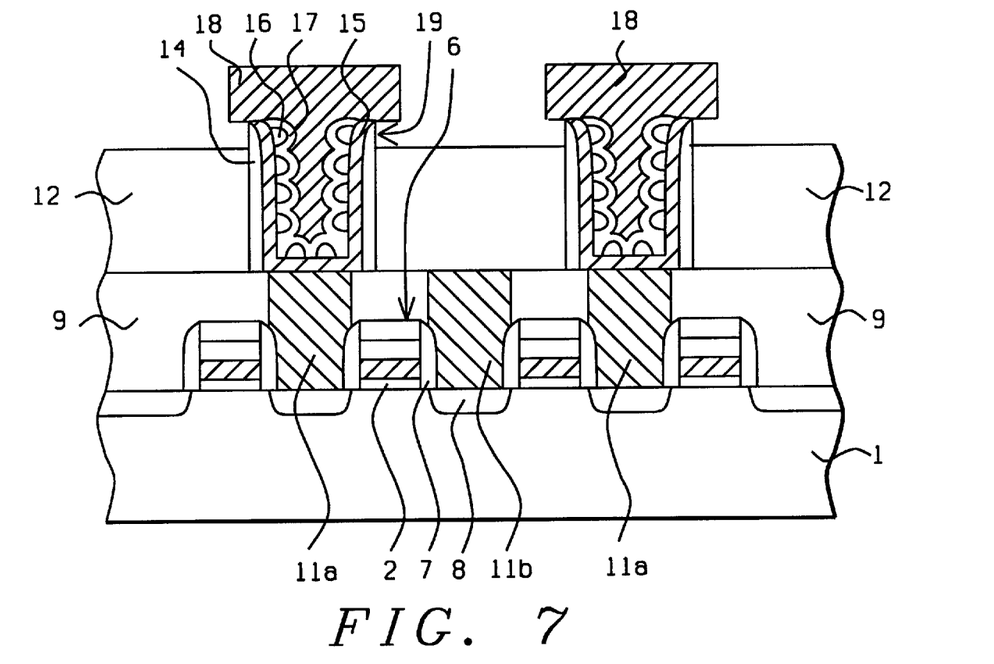

After completion of the capacitor structures, each comprised of polysilicon top plate structure 18, capacitor dielectric layer 17, and the storage node structure comprised of HSG silicon layer 16, and polysilicon layer 15, a selective etch procedure is used to remove a top portion of IPD layer 12, thinning IPD layer 12, and thus exposing a top portion 19, of insulator spacers 14. The thinning of IPD layer 12, is comprised of removal of between about 400 to 700 Angstroms, via use of a buffered hydrofluoric (BHF), acid solution, with the selective BHF procedure not removing exposed regions of polysilicon. This is schematically shown in FIG. 7.

Figure 8:
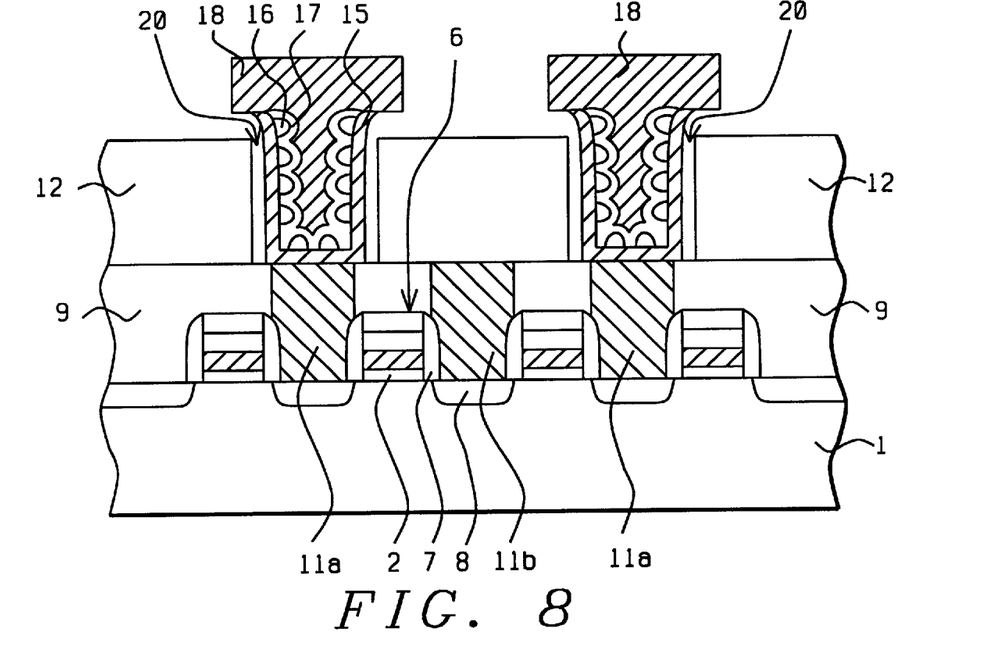

A critical step, the removal of insulator spacers 14, is next addressed, with the result of his procedure schematically shown in FIG. 8. A hot phosphoric acid solution, at a temperature between about 150 to 160° C., is used to selectively remove only exposed silicon nitride. The wet etch, hot phosphoric acid procedure removes the portion 19, of silicon nitride, insulator spacers, exposed as a result of the thinning of IPD layer 12, with the isotropic component of this wet etch procedure then continuing to completely remove the entire silicon nitride insulator spacers, resulting in air gap 20, located between the bottom portion of the capacitor structure, and the remaining bottom portion of IPD layer 12. The selectivity, or etch rate ratio of silicon nitride to either silicon oxide or polysilicon, in hot phosphoric acid, is about 100 to 1, thus allowing only removal of silicon nitride. Air gap 20, schematically shown in FIG. 8, will provide the lowest dielectric constant material for the space between the capacitor structures and a subsequent bit line contact structure.

Figure 9:
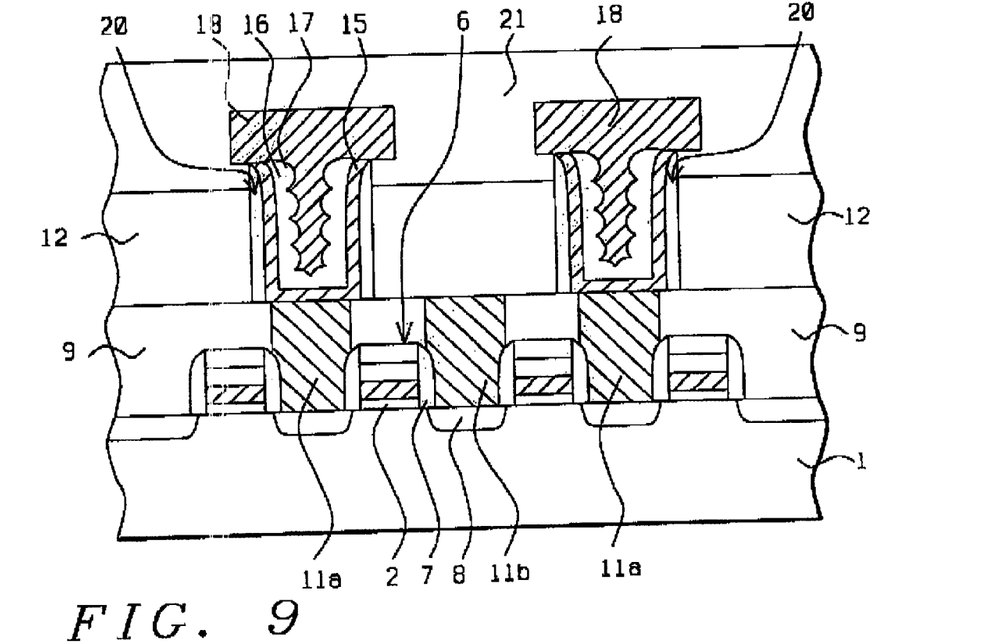

To preserve air gap 20, for the desired capacitance reduction between capacitor and bit line structures, a deposition mode featuring poor gap filling characteristics is chosen for overlying silicon oxide layer 21. A PECVD procedure, using tetraethylorthosilicate (TEOS), as a silicon oxide source, is performed at a temperature between about 400 to 450° C., and at a pressure between about 1 to 10 mtorr, depositing silicon oxide layer 21, at a thickness between about 5000 to 6000 Angstroms. The poor conformality of this silicon oxide layer results in poor gap filling, therefore sealing air gap 20. This is schematically shown in FIG. 9.

Figure 10:
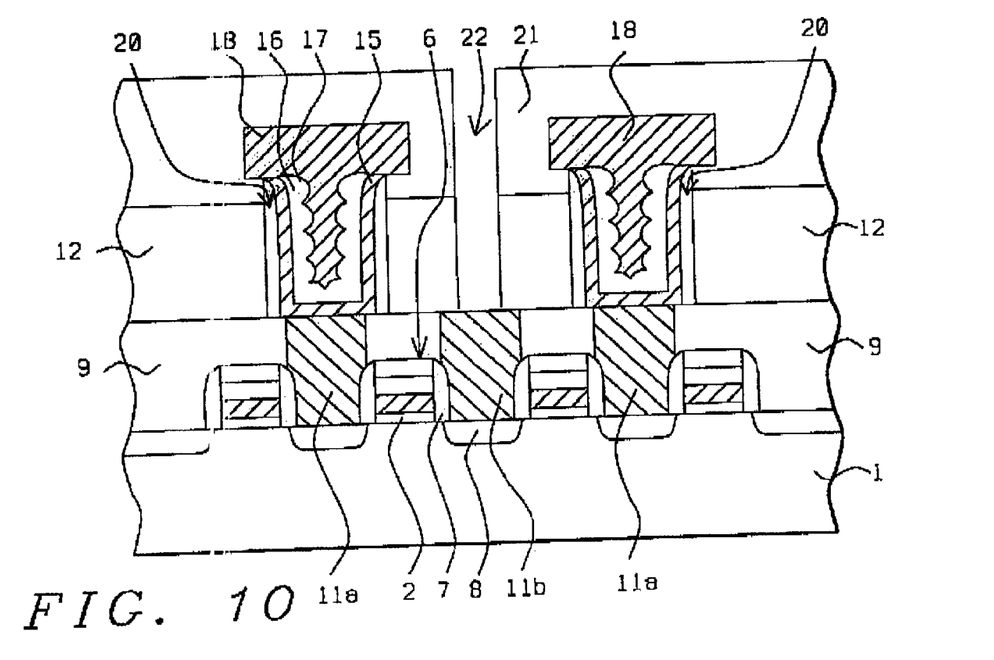
Figure 11:
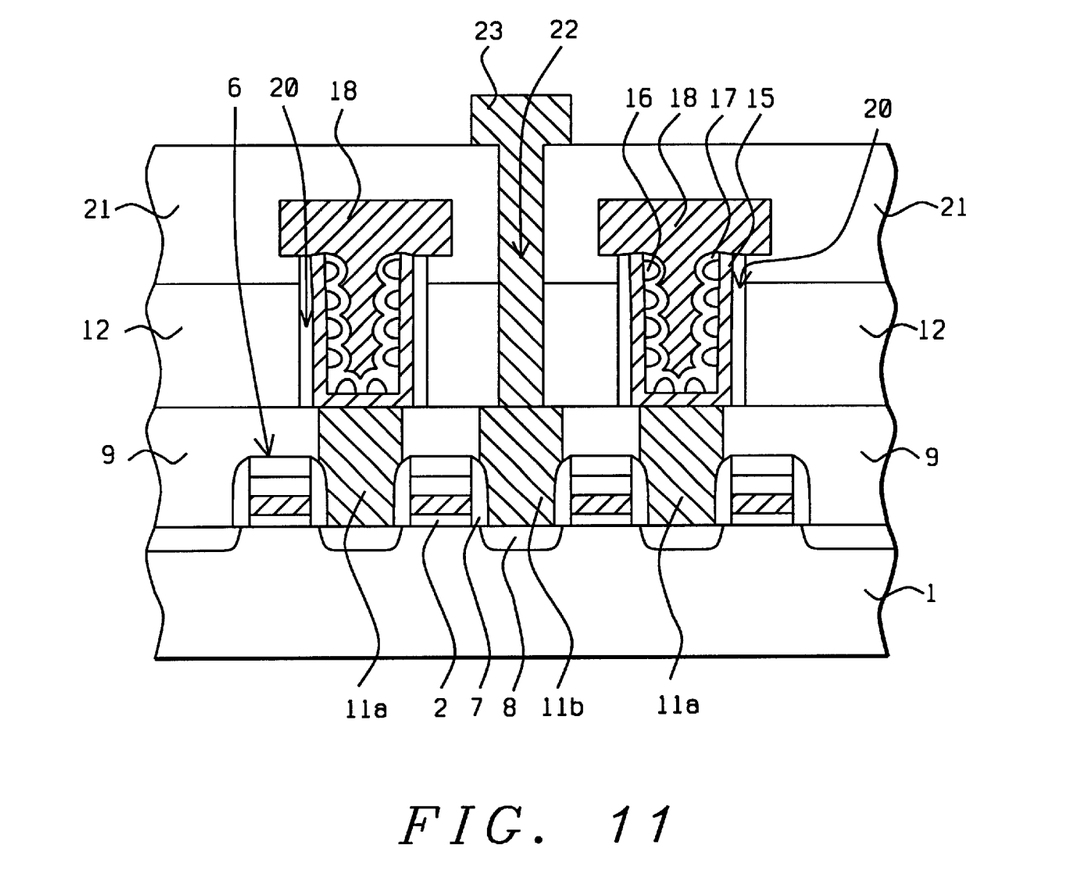

The formation of bit line contact hole opening 22, is next addressed and schematically described using FIG. 10. A photoresist shape, (not shown in the drawings), is used as an etch mask, allowing an anisotropic RIE procedure using $C_4F_8$ as an etchant, to define bit line contact hole opening 22, in silicon oxide layer 21, and in IPD layer 12, exposing a portion of the top surface of plug structure 11b. After removal of the photoresist shape used to define bit line contact hole 22, via plasma oxygen ashing procedures, a conductive layer such as tungsten, aluminum, or aluminum—copper, is deposited via plasma vapor deposition procedures to a thickness between about 1200 to 2000 Angstroms, completely filling bit line contact hole 22. A photoresist shape (not shown in the drawings), is next used as a mask to allow a RIE procedure using $Cl_2$ as an etchant, to remove the portions of the conductive layer from the top surface of silicon oxide layer 21, resulting in the formation of bit line structure 23. A bottom portion of bit line structure 23, located in bit line contact hole 22, is regarded as the bit line contact structure, overlying and contacting plug structure 11b, while a top portion of bit line structure 23, overlays a portion of the top surface of silicon oxide layer 21. This is schematically shown in FIG. 11. The ability to form air gap regions 20, located on the sides of the capacitor openings, will allow the performance of the CUB DRAM device to be enhanced via a reduction in the performance degrading capacitance generated between the capacitor structures and the bit line structure.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a capacitor under bit line (CUB), dynamic random access memory (DRAM), device, on a semiconductor substrate, comprising the steps of:

providing gate structures on an underlying gate insulator layer, with source/drain regions located in portions of said semiconductor substrate not covered by said gate structures;

forming conductive plug structures overlying and contacting said source/drain regions;

forming capacitor openings in a first insulator layer, with a first capacitor opening exposing a portion of a top surface of a first conductive plug structure, and with a second capacitor opening exposing a portion of a top surface of a second conductive plug structure;

forming insulator spacers on the sides of said capacitor openings;

forming capacitor structures in said capacitor openings, overlying and contacting exposed portions of said first, and of said second conductive plug structure;

selectively removing a top portion of said first insulator layer exposing top portions of said insulator spacers;

selectively removing insulator spacers, resulting in formation of air gaps in sides of said capacitor openings, with said air gaps located between said capacitor structures and bottom portion of said first insulator layer;

depositing a second insulator layer completely covering said capacitor structures, but leaving said air gaps unfilled;

forming a bit line contact hole in said second insulator layer and in said first insulator layer, exposing a portion of a top surface of a third conductive plug structure, with said third conductive plug structure located between said first, and said second conductive plug structure; and forming a bit line contact structure in said bit line contact hole.

2. The method of claim 1, wherein said conductive plug structures are polysilicon plug structures, formed from an in situ doped polysilicon layer which was obtained via LPCVD procedures, to a thickness between about 3000 to 4000 Angstroms.

3. The method of claim 1, wherein said first insulator layer is a silicon oxide layer obtained via LPCVD or PECVD procedures at a thickness between about 21000 to 25000 Angstroms.

4. The method of claim 1, wherein said insulator spacers are silicon nitride spacers, obtained via deposition of a silicon nitride layer via LPCVD or PECVD procedures, to a thickness between about 300 to 500 Angstroms, then defined via an anisotropic RIE procedure using $CF_4$ and $CHF_3$ as etchants.

5. The method of claim 1, wherein said insulator spacers are boro-phosphosilicate glass (BPSG), spacers, obtained via deposition of a BPSG layer via PECVD procedures, to a thickness between about 300 to 500 Angstroms, then defined via an anisotropic RIE procedure using $C_4F_8$ as an etchant.

6. The method of claim 1, wherein each capacitor structure is comprised of: an underlying storage node storage, in turn comprised of an underlying in situ doped polysilicon layer and an overlying hemispherical grain silicon layer; a capacitor dielectric layer comprised of either ONO, NO, or tantalum oxide, at an equivalent silicon oxide thickness between about 30 to 50 Angstroms; and an overlying in situ doped polysilicon top plate structure.

7. The method of claim 1, wherein selective removal of said top portion of said first insulator layer is accomplished via use of a buffered hydrofluoric acid solution, wherein the removed said top portion of said first insulator layer is between about 400 to 700 Angstroms.

8. The method of claim 1, wherein said insulator spacers are selectively removed using a hot phosphoric acid solution, at a temperature between about 150 to 160° C., wherein the etch rate ratio of silicon nitride to either silicon oxide or to polysilicon, in hot phosphoric acid, is about 100 to 1.

9. The method of claim 1, wherein said second insulator layer is a silicon oxide layer deposited to a thickness between about 5000 to 6000 Angstroms, via PECVD procedures performed at a temperature between about 400 to 450° C., at a pressure between about to 10 torr, and using tetraethylorthosilicate (TEOS), as a source.

10. A method of fabricating a capacitor under bit line (CUB), dynamic random access memory (DRAM), device, on a semiconductor substrate, featuring air gap isolation regions formed between a bit line contact structure and capacitor structures, comprising the steps of:

forming silicon nitride capped, gate structures on an underlying silicon dioxide gate insulator layer, with source/drain regions located in portions of said semiconductor substrate not covered by said silicon nitride capped, gate structures;

forming polysilicon plug structures in openings in a planarized first silicon oxide layer, with said polysilicon plug structures overlying and contacting said source/drain regions;

depositing a second silicon oxide layer;

forming a first capacitor opening in said second silicon oxide layer exposing a top portion of a first polysilicon plug structure, and forming a second capacitor opening in said second silicon oxide layer exposing a top portion of a second polysilicon plug structure;

depositing a silicon nitride layer;

performing an anisotropic RIE procedure to from silicon nitride spacers on the sides of said capacitor openings, forming a storage node structure in each capacitor opening, with each said storage node structure interfacing sides of said silicon nitride spacers;

forming a capacitor dielectric layer on storage node structures;

forming an in situ doped polysilicon top plate structure in each said capacitor opening;

selectively removing a top portion of said second silicon oxide layer exposing top portions of said silicon nitride spacers;

selectively removing silicon nitride spacers forming said air gap isolation regions located between said storage node structures, and a bottom portion of said second silicon oxide layer;

depositing a third silicon oxide layer with conformality characteristics that result in said third silicon oxide layer covering said in situ polysilicon top plate structure, but leaving said air gap isolation regions uncovered and unfilled;

forming a bit line contact hole in said third silicon oxide layer and in said second silicon oxide layer, exposing a portion of a top surface of a third polysilicon plug structure, which is located between said first polysilicon plug structure, and said second polysilicon plug structure; and forming said bit line contact structure in said bit line contact hole.

11. The method of claim 10, wherein said second silicon oxide layer is obtained via LPCVD or PECVD procedures to a thickness between about 21000 to 25000 Angstroms.

12. The method of claim 10, wherein said capacitor openings are formed via anisotropic RIE procedures, using $C_4F_8$ as an etchant for said silicon oxide layer.

13. The method of claim 10, wherein said silicon nitride layer is obtained via LPCVD or PECVD procedures, at a thickness between about 300 to 500 Angstroms.

14. The method of claim 10, wherein said silicon nitride spacers are defined via an anisotropic RIE procedure, applied to said silicon nitride layer, using $CF_4$ and $CHF_3$ as etchants.

15. The method of claim 10, wherein said storage node structure is comprised of an underlying in situ doped polysilicon layer and an overlying hemispherical grain silicon layer.

16. The method of claim 10, wherein said capacitor dielectric layer is either an ONO layer, a NO layer, or a tantalum oxide layer, at an equivalent silicon oxide thickness between about 30 to 50 Angstroms.

17. The method of claim 10, wherein said top portion of said second silicon oxide layer, between about 400 to 700 Angstroms, is selectively removed via use of a buffered hydrofluoric acid solution.

18. The method of claim 10, wherein said silicon nitride spacers are selectively removed using a hot phosphoric acid solution, at a temperature between about 150 to 160° C., wherein the hot phosphoric acid etch rate ratio of silicon nitride to either silicon oxide or to polysilicon, is about 100 to 1.

19. The method of claim 10, wherein said third silicon oxide layer is obtained at a thickness between about 5000 to 6000 Angstroms, via PECVD procedures, performed at a temperature between about 400 to 450° C., at a pressure between about 1 to 10 mtorr, and using tetraethylorthosilicate (TEOS), as a source.

* * * * *